(12) United States Patent
Sakai

(10) Patent No.: US 7,773,814 B2
(45) Date of Patent: Aug. 10, 2010

(54) MULTI-SCALE ANALYSIS DEVICE

(75) Inventor: Hidehisa Sakai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1350 days.

(21) Appl. No.: 11/237,936

(22) Filed: Sep. 29, 2005

(65) Prior Publication Data
US 2007/0005310 A1    Jan. 4, 2007

(30) Foreign Application Priority Data
Jun. 29, 2005   (JP) .............................. 2005-190157

(51) Int. Cl.
*G06K 9/68* (2006.01)
(52) U.S. Cl. ...................... 382/227; 382/226; 382/181; 382/224; 703/2
(58) Field of Classification Search ................ 382/227, 382/226, 181, 224; 345/419, 420; 703/2, 703/7, 8, 21; 708/446, 200, 208, 209, 212, 708/620
See application file for complete search history.

(56) References Cited
U.S. PATENT DOCUMENTS

| | | | |
|---|---|---|---|
| 5,892,515 A | 4/1999 | Kobayashi et al. | |
| 6,618,694 B1 | 9/2003 | Shibuya et al. | |
| 7,275,023 B2 * | 9/2007 | Chen et al. | 703/2 |
| 7,324,103 B2 * | 1/2008 | Stewart et al. | 345/420 |
| 2005/0065989 A1 * | 3/2005 | Akiba et al. | 708/446 |

FOREIGN PATENT DOCUMENTS

| JP | 10-334276 | 12/1998 |
|---|---|---|
| JP | 2001-027994 | 1/2001 |
| JP | 2001-350802 | 12/2001 |

* cited by examiner

*Primary Examiner*—Samir A. Ahmed
*Assistant Examiner*—Ali Bayat
(74) *Attorney, Agent, or Firm*—Staas & Halsey LLP (57) ABSTRACT

The distortion of each node is calculated from the distortions of respective elements in the finite element analysis result of a global model of a structure, and a second-order coefficient of a quadratic function representing the displacement at each node of a micro model is calculated from distortions of respective nodes. In addition, a constant term and a first-order coefficient of the quadratic function are calculated from the displacements of the respective nodes of the global model. Then, the displacement at each boundary node of the micro model is calculated using the obtained quadratic function and a finite element analysis of the micro model is performed.

4 Claims, 10 Drawing Sheets

MULTI-SCALE ANALYSIS DEVICE

BACKGROUND OF THE INVENTION

1. Field of the Invention

The present invention relates to a multi-scale analysis device for performing structural analysis on a multi-scale, from global (macro) structures to micro structures, using a finite element method.

2. Description of the Related Art

It is realistically impossible to analyze entire structures on a minute scale when analyzing large-scale structures such as ships, airplanes and automobiles, or structures, such as electronic devices, having a multi-layer structure from entire meter-order devices to nanometer-order LSI (large scale integration) internal structures. This is because, in such minute analyses, computer capacity may be insufficient or modeling may require enormous costs.

However, in order to evaluate the fatigue strength of a fine structure part and the like, it is necessary to determine the stress concentration due to its minute shape, and modeling of the minute shape is essential. Therefore, in the analysis of structures such as these, a method commonly called zooming analysis is used.

With this method, first, the entire behavior is analyzed, providing load conditions such as load and temperatures to a global model created with rough finite element mesh by simplifying the entire structure. Then, a model wherein minute mesh division is performed to the area of which minute stress is to be determined is created separately, appropriate boundary conditions are provided based on the results of the global analysis, and minute analysis is performed. Generally, in electronic devices, the structure is divided into a number of levels, such as the entire device, unit parts, LSI package, LSI internal wiring, and zooming analysis is performed in multi-levels.

Figure 1A:
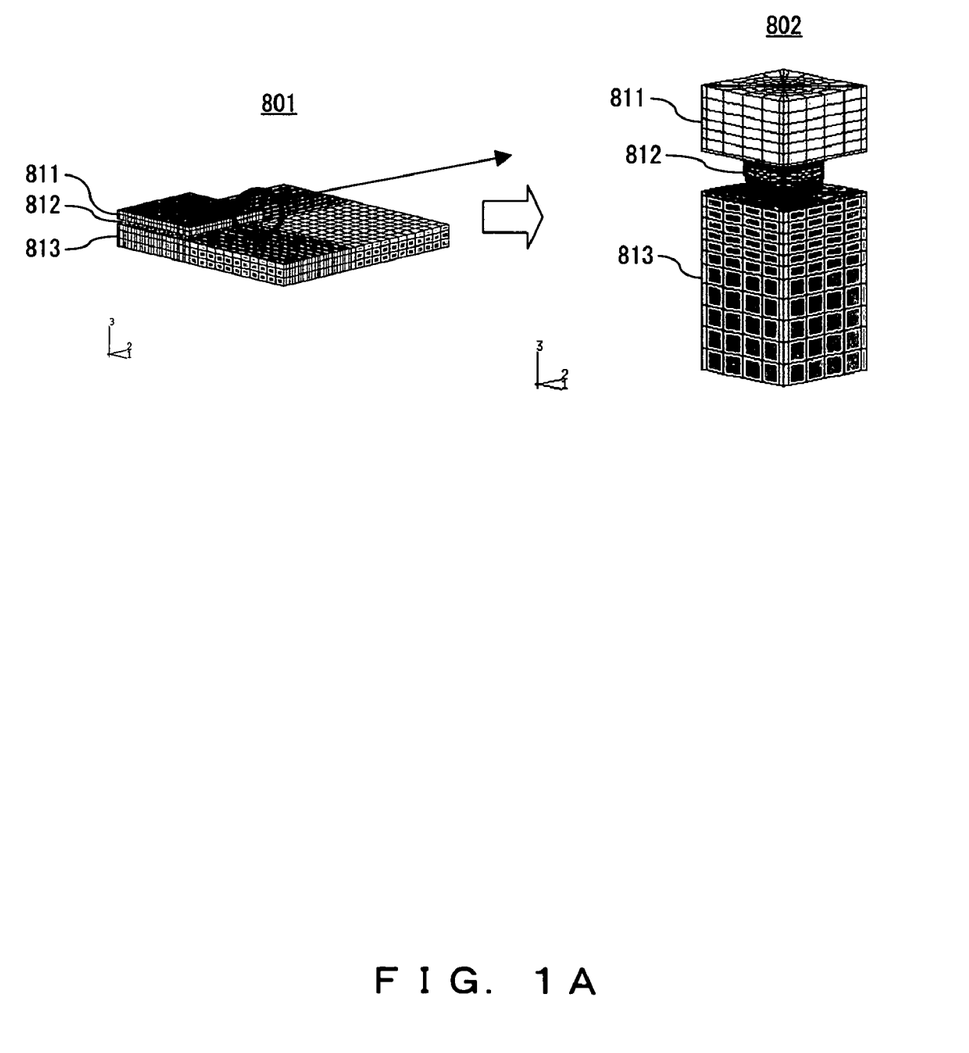
FIG. 1A is a diagram showing conventional zooming analysis.

FIG. 1A shows an example of a zooming analysis of an electronic device such as this. In this example, package 811 is fixed to substrate 813 by soldering 812, and a fine mesh micro-model 802 is formed on a part of a rough mesh global model 801.

A displacement or load which is obtained by an analysis in one-level-higher scale is given as the boundary condition in the zooming analysis. In many cases, a micro analysis is performed with a displacement obtained by a global analysis as a displacement in a micro-structure.

However, in zooming analysis, because minute analysis is performed using the results of global analysis by mesh which is rougher in comparison to a micro-structure, accuracy is an issue. When creating models for preventing this issue, large amounts of experience are required in the modeling method, such as appropriate mesh division in global structures and micro-structures, definition of boundary nodes in micro-structures and the like.

As conventional methods for determining the node displacement of a micro-structure, the following two methods are given:

(1) Matching the position of the boundary node of the micro-structure to the node position of the global structure (2) Determining the boundary displacement of the micro-structure by interpolating the displacement of the global analysis result.

Figure 1B:
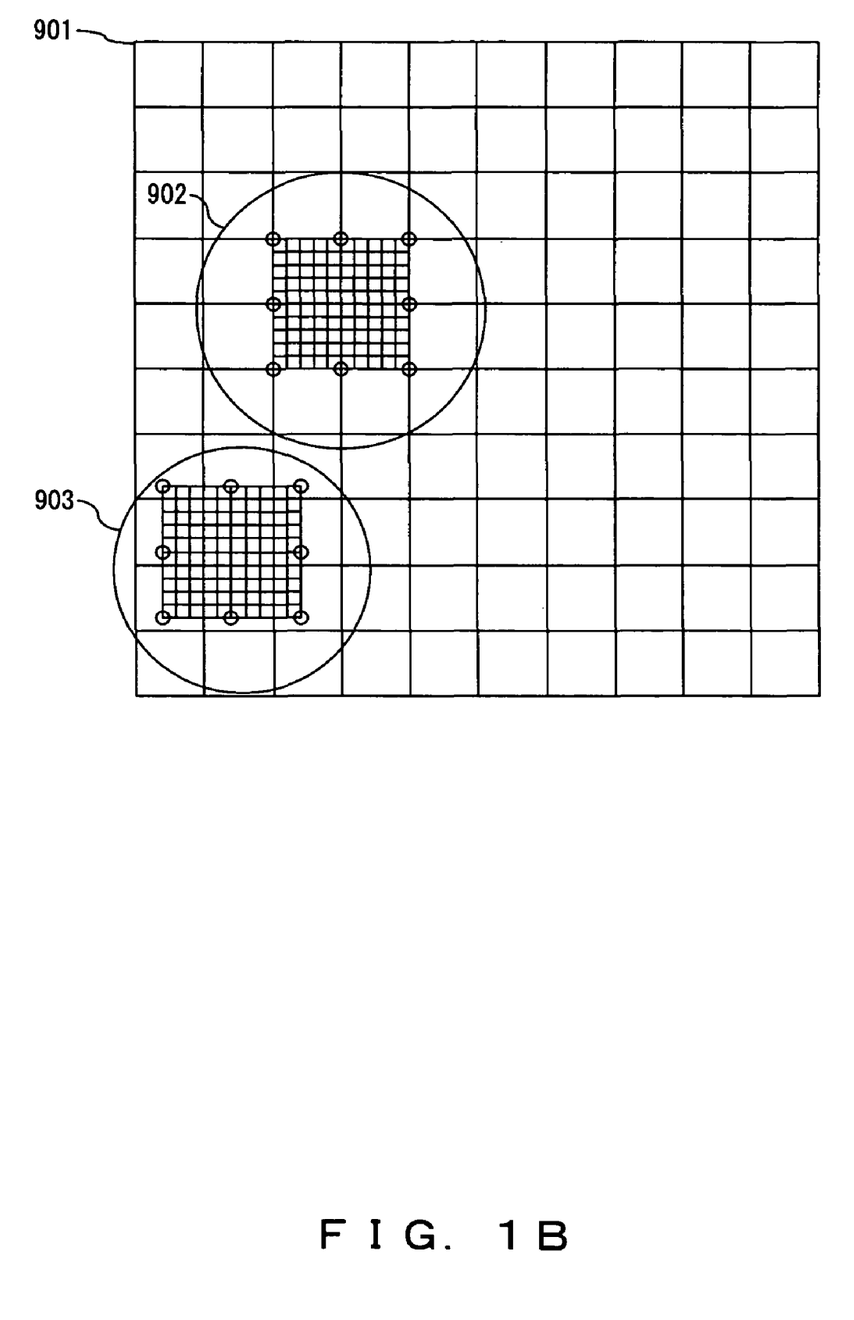
FIG. 1B is a diagram showing nodes of a conventional micro-structure.

In the foregoing method (1), as shown in FIG. 1B, the coordinate position of the boundary node of the micro model 902 completely matches the node position of the global model 901. In this case, the mesh of global model 901 and the mesh of micro model 902 are appropriately divided as boundary conditions, and the node which provides the boundary conditions of micro model 902 (shown as ○ in FIG. 1B) must completely match the node of the mesh of the global model 901.

Here, if the boundary node displacement of the micro-structure is um and the analysis result displacement of the global structure is ug, the following expression can be obtained:

$$um(x,y,z) = ug(x,y,z) \qquad (1)$$

In expression (1), x, y and z indicate space coordinates, and expression (1) indicates defining of the boundary displacement of a micro-structure using the node displacement of the global analysis result with regards to nodes with equal space coordinates in global structure and micro structure.

When performing zooming analysis, specifically, by finite element method, either one of the following two methods is used.

a) The operator reads the node displacement of a global structure from the results of a global analysis and manually adds this to the boundary node of a micro-structure as boundary conditions. Although this method is effective because it can be realized without depending on a simulation program when the number of boundary nodes of the micro-structure is small, it is not realistic when the number of boundary nodes increase.

b) A boundary node group in a micro analysis is defined first, and in the preparation stage prior to the execution of micro-structure simulation, global structure nodes with coordinates which match the space coordinates of the nodes belonging to the boundary node group of the micro-structure are retrieved from the results of global analysis. Then, a micro analysis is performed using displacements of these nodes. In this method, the simulation program per se must have a zooming analysis function or a program for performing zooming processing must be prepared separately.

In the foregoing method (2), the boundary node displacement of the micro-structure is determined by interpolating the node displacement of the global analysis results. In this method, as shown in FIG. 1B, it is not necessary for the node coordinates of micro model 903 to match the node coordinate positions of global model 901, and therefore, in comparison with method (1), the mesh of micro model 903 can be created freely.

In this case, although it is necessary to interpolate node displacement providing boundary conditions of the micro-structure from the global analysis results, various methods can be considered. Below, a two-dimensional plane problem is assumed and, as shown in FIG. 1C, a method for performing interpolation by considering the three global nodes in the vicinity of the micro model node to be a triangular element and using a shape function of the triangular element is described.

Figure 1C:
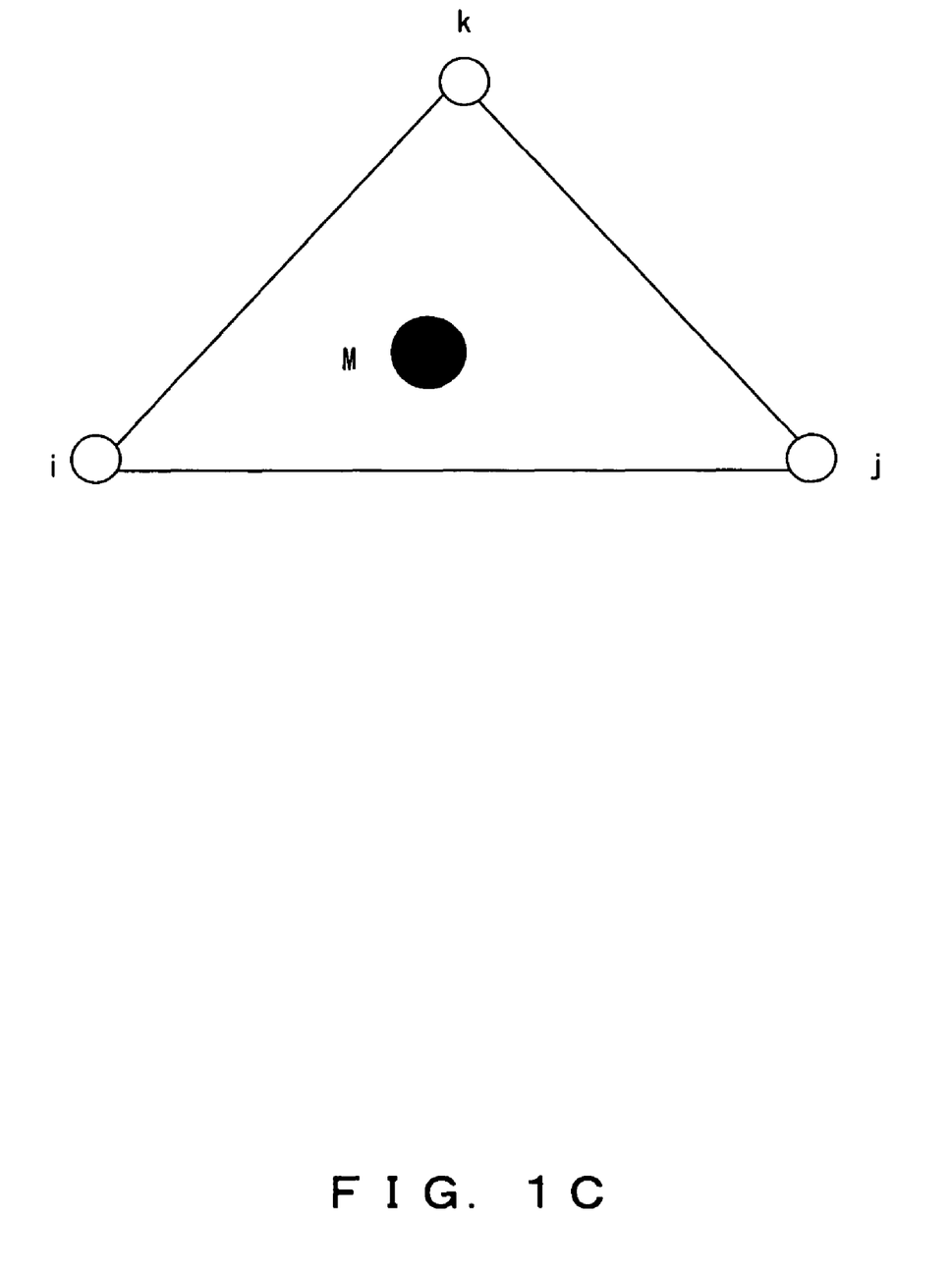
FIG. 1C is a diagram showing a triangular element.

In FIG. 1C, nodes i, j, and k are nodes on the mesh of a global structure and node M is a node on the mesh of a micro structure. If the space coordinates of the node is (x, y), and displacements in the x direction and the y direction are respectively u and v, the coordinates and displacements of the four nodes are indicated as follows:

i coordinates (xi, yi) displacements (ui, vi)
j coordinates (xj, yj) displacements (uj, vj)
k coordinates (xk, yk) displacements (uk, vk)
M coordinates (xm, ym) displacements (um, vm)

Inside the triangular element, displacement is approximated as a linear function with respect to space coordinates.

$$u(x,y)=a+bx+cy$$

$$v(x,y)=d+ex+fy \quad (2)$$

Node displacements (ui, vi) to (uk, vk) must also fulfill expression (2), and therefore, the following expressions are obtained.

$$\begin{pmatrix} 1 & xi & yi \\ 1 & xj & yj \\ 1 & xk & yk \end{pmatrix} \begin{pmatrix} a \\ b \\ c \end{pmatrix} = \begin{pmatrix} ui \\ uj \\ uk \end{pmatrix} \quad (3)$$

$$\begin{pmatrix} 1 & xi & yi \\ 1 & xj & yj \\ 1 & xk & yk \end{pmatrix} \begin{pmatrix} d \\ e \\ f \end{pmatrix} = \begin{pmatrix} vi \\ vj \\ vk \end{pmatrix} \quad (4)$$

Because (xi, yi) to (xk, yk) in expression (3) and expression (4) are coordinates of global nodes, it is known at the time global analysis is completed. Therefore, if ui to uk and vi to vk are known, respective in variables, a to f, can be determined from the inverse matrices of expression (3) and expression (4). For example, the inverse matrix of expression (3) is as follows:

$$\begin{pmatrix} \frac{-xkyj+xjyk}{\Delta} & \frac{xkyi-xiyk}{\Delta} & \frac{-xjyi+xiyj}{\Delta} \\ \frac{yj-yk}{\Delta} & \frac{-yi+yk}{\Delta} & \frac{yi-yj}{\Delta} \\ \frac{-xj+xk}{\Delta} & \frac{xi-xk}{\Delta} & \frac{-xi+xj}{\Delta} \end{pmatrix} \quad (5)$$

Denominator $\Delta$ common to respective matrix elements is expressed as follows:

$$\Delta = -xjyi + xkyi + xiyj - xkyj - xiyk + xjyk \quad (6)$$

If the inverse matrix of (5) is multiplied from the left side of expression (3), the following expressions can be obtained as expressions to determine invariables a, b, and c.

$$a=[uk(-xjyi+xiyj)+uj(xkyi-xiyk)+ui(-xkyj+xjyk)]/\Delta$$

$$b=[uk(yi-yj)+ui(yj-yk)+uj(yk-yj)]/\Delta$$

$$c=[uk(xi-xj)+ui(xj-xk)+uj(xk-xj)]/\Delta \quad (7)$$

In the same way, if the inverse matrix of (5) is multiplied from the left side of expression (4), the following expressions, wherein u in expression (7) are replaced with v, can be obtained as expressions to determine invariables d, e, and f.

$$d=[vk(-xjyi+xiyj)+vj(xkyi-xiyk)+vi(-xkyj+xjyk))]/\Delta$$

$$e=[vk(yi-yj)+vi(yj-yk)+vj(yk-yj)]/\Delta$$

$$f=[vk(xi-xj)+vi(xj-xk)+vj(xk-xj)]/\Delta \quad (8)$$

The boundary node displacements of node M of the micro-structure, (um, vm), can be calculated as follows using the invariables determined in expression (7) and expression (8).

$$um(xm,ym)=a+bxm+cym$$

$$vm(xm,ym)=d+exm+fym \quad (9)$$

Although two-dimensional problems are used as examples in the foregoing calculations, in instances of one-dimensional problems, it is a simple linear interpolation. In addition, if it is a three-dimensional problem, a tetrahedral element composed of neighboring four nodes of a global model is assumed and calculations similar to those for the two-dimensional problems are performed.

The patent references 1 to 3, below, are related to a structure analysis using a finite element method.

Patent Reference 1: Japan Patent Application Publication No. 2001-350802

Patent Reference 2: Japan Patent Application Publication No. 2001-027994

Patent Reference 3: Japan Patent Application Publication No. 10-334276

Out of the conventional methods described above for determining the node displacements of a micro-structure, in the method for determining the node displacements of the micro-structure from the displacements of global analysis results through the linear interpolation in expression (9), if the average mesh size of the global model is $\Delta x$, an approximation error proportional to $\Delta x^2$ is generated. Therefore, there are limits with regards to accuracy, and in order to obtain accurate analysis results, $\Delta x$ must be set to a small value and the computer processing time required for global analysis increases.

SUMMARY OF THE INVENTION

The object of the present invention is to enhance the accuracy of obtained analysis results without significantly changing the zooming analysis program using a finite element method.

The multi-scale analysis device of the present invention comprises an analysis result storage device, a first calculation formula storage device, a second calculation formula storage device, a distortion calculation device, a distortion storage device, a displacement calculation device, a displacement storage device, and an analysis device and performs a finite element analysis of a structure, from a global structure to a micro-structure.

The analysis result storage device stores information of coordinates and displacements of respective nodes and distortions of respective elements in a finite element analysis result of a global model wherein the structure is mesh-divided. The first calculation formula storage device stores a first calculation formula for determining a constant term and a first-order coefficient of a quadratic function of coordinates from the coordinates and displacements of the respective nodes of the global model, when a displacement of each node of a micro model wherein the structure is mesh-divided finer than the global model is expressed as the quadratic function. The second calculation formula storage device stores a second calculation formula for determining a second-order coefficient of the quadratic function from the coordinates and distortions of the respective nodes of the global model.

The distortion calculation device calculates a distortion of each node of the global model from distortions of a plurality of elements existing in the vicinity of the node, and the distortion storage device stores information of the obtained distortion of each node.

The displacement calculation device calculates the constant term and first-order coefficient from the coordinates and displacements of the respective nodes of the global model using the first calculation formula, calculates the second-order coefficient from the coordinates of the respective nodes of the global model and the distortions of the respective nodes stored in the distortion storage device using the second calculation formula, and calculates a displacement of each boundary node of the micro model using the obtained constant term, first-order coefficient, and second-order coefficient.

The displacement storage device stores information of the obtained displacement of each boundary node, and the analysis device performs a finite element analysis of the micro model using the displacement of each boundary node stored in the displacement storage device as a boundary condition of the micro model and outputs an analysis result.

DESCRIPTION OF THE PREFERRED EMBODIMENTS

The preferred embodiments are hereafter described in detail, with reference to the drawings.

Figure 2A:
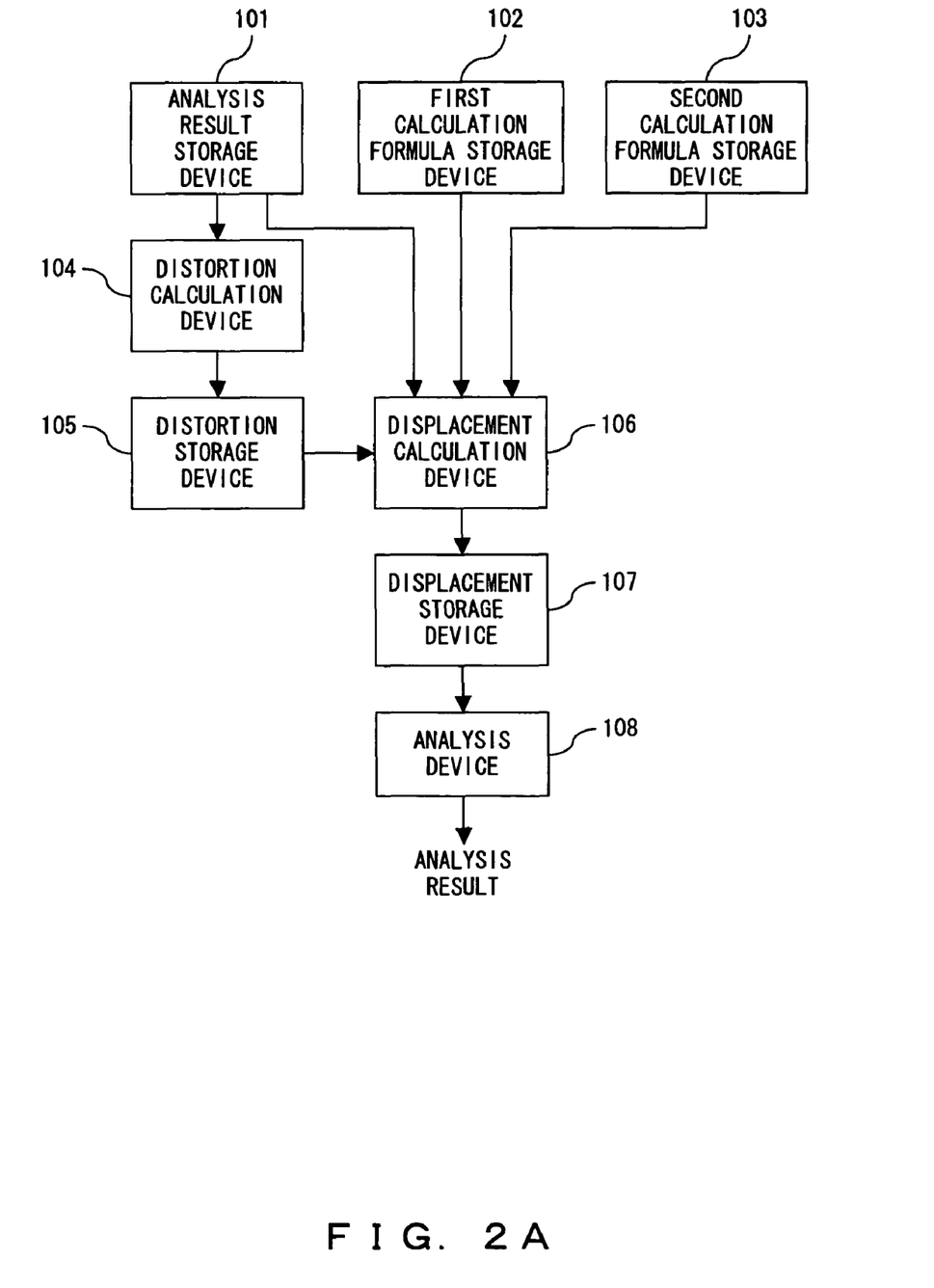
FIG. 2A is a principle diagram of a multi-scale analysis device of the present invention.

FIG. 2A is a principle diagram of a multi-scale analysis device of the present invention. The multi-scale analysis device in FIG. 2A comprises an analysis result storage device 101, a first calculation formula storage device 102, a second calculation formula storage device 103, a distortion calculation device 104, a distortion storage device 105, a displacement calculation device 106, a displacement storage device 107, and an analysis device 108 and performs a finite element analysis of a structure, from a global structure to a micro-structure.

The analysis result storage device 101 stores information of coordinates and displacements of respective nodes and distortion of respective elements in the finite element analysis result of a global model wherein the structure is mesh-divided. The calculation formula storage device 102 stores a first calculation formula for determining a constant term and a first-order coefficient of a quadratic function of coordinates from the coordinates and displacements of the respective nodes of the global model, when a displacement of each node of a micro model wherein the structure is mesh-divided finer than the global model is expressed as the quadratic function. The calculation formula storage device 102 stores a second calculation formula for determining a second-order coefficient of the quadratic function from the coordinates and distortions of the respective nodes of the global model.

The distortion calculation device 104 calculates a distortion of each node of the global model from distortions of a plurality of elements existing in the vicinity of the node, and the distortion storage device 105 stores information of the obtained distortion of each node.

The displacement calculation device 106 calculates the constant term and first-order coefficient from the coordinates and displacements of the respective nodes of the global model using the first calculation formula, calculates the second-order coefficient from the coordinates of the respective nodes of the global model and the distortions of the respective nodes stored in the distortion storage device 105 using the second calculation formula, and calculates a displacement of each boundary node of the micro model using the obtained constant term, first-order coefficient, and second-order coefficient.

The displacement storage device 107 stores information of the obtained displacement of each boundary node, and the analysis device 108 performs a finite element analysis of the micro model using the displacement of each boundary node stored in the displacement storage device 107 as a boundary condition of the micro model and outputs an analysis result.

The distortion calculation device 104 extracts the distortions of elements existing in the vicinity of a node of the global model from the analysis result storage device 101, calculates the distortion of the node using the distortions of these elements, and stores the distortion to the distortion storage device 105.

The displacement calculation device 106 extracts the first calculation formula from the calculation formula storage device 102, extracts information of the coordinates and displacements of respective nodes of the global model from the analysis result storage device 101, and calculates the constant term and first-order coefficient from the coordinates and displacements using the first calculation formula.

In addition, the displacement calculation device 106 extracts the second calculation formula from the calculation formula storage device 103, extracts information of the coordinates of the respective nodes of the global model from the analysis result storage device 101, extracts information of the distortions of the respective nodes from the distortion storage device 105, and calculates the second-order coefficient from these coordinates and distortions using the second calculation formula.

Next, the displacement calculation device 106 calculates the displacement of each boundary node of the micro model using the obtained constant term, first-order coefficient, and second-order coefficient, and the analysis device 108 performs the finite element analysis using this displacement as the boundary condition of the micro model.

According to a multi-scale analysis device as such, the displacements of respective nodes of the micro model can be shown as quadratic functions of coordinates by using the distortions in respective nodes of the global model. Through this, interpolation can be performed and the boundary conditions of the micro model can be set with a higher accuracy than when using linear functions. In this case, the accuracy of micro analysis can be enhanced by merely changing the calculation of the boundary conditions, without changing the algorithm of the global analysis and micro analysis.

Figure 6:
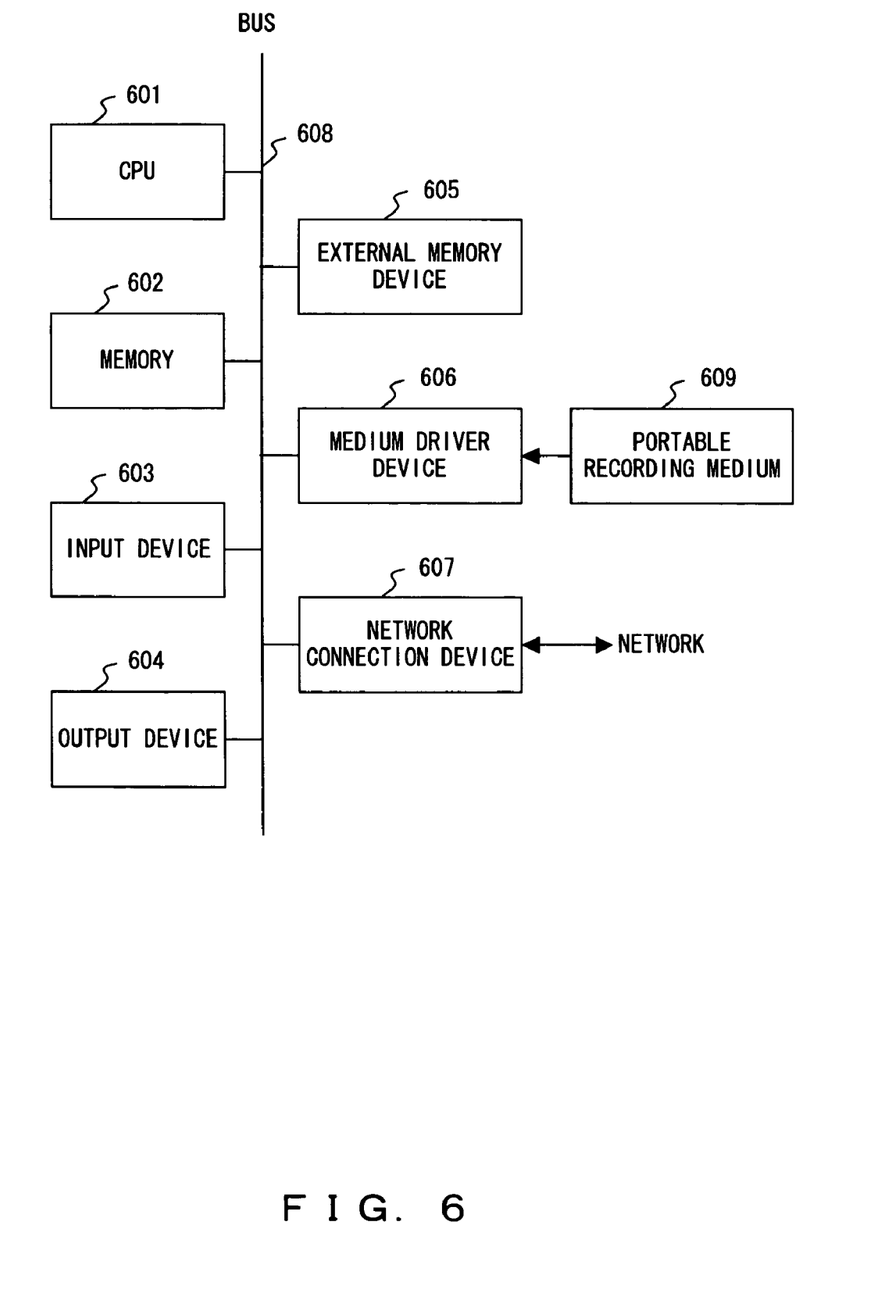
FIG. 6 is a block diagram of an information processing device.

The analysis result storage device 101, calculation formula storage device 102, calculation formula storage device 103, distortion storage device 105, and displacement storage device 107 correspond to memory 602 in FIG. 6, described hereafter, for example and distortion calculation device 104, displacement calculation device 106, and analysis device 108 correspond to CPU (central processing unit) 601 in FIG. 6, for example.

According to the present invention, if the average mesh size of the global model is $\Delta x$, a high-accuracy zooming analysis wherein error is held at about $\Delta x^3$ becomes possible. In addition, if only accuracy of about the same degree as conventional linear interpolation is required, global model which is rougher than that in linear interpolation can be used.

In the present embodiment, zooming analysis is performed by performing displacement interpolation of a higher accuracy than is conventional, using node distortion of the global model when calculating by the finite element method. Specific procedures are described hereafter.

In finite element analysis, aside from displacement, distortion and stress are calculated simultaneously. Distortion is defined as a gradient of displacement, and the definition of distortion in the foregoing two-dimensional plane problem is as follows:

$$\epsilon x = \partial u/\partial x$$
$$\epsilon y = \partial v/\partial y$$
$$\gamma xy = \partial u/\partial y + \partial v/\partial x \tag{10}$$

Here, $\epsilon x$ indicates distortion in the x direction, $\epsilon y$ indicates distortion in the y direction, and $\gamma xy$ indicates shear distortion. If the triangular element shown in FIG. 1C are taken into consideration, the displacement in the x direction can be indicated as u (x, y)=a+bx+cy, as shown in expression (2), and therefore the following expression can be obtained from expressions (10).

$$\epsilon x = \partial u/\partial x = b \tag{11}$$

Therefore, $\epsilon x$ becomes a constant value b inside the triangular element. Then, because the values of distortion differ between adjacent triangular elements, when taking into consideration distortion at respective nodes comprising a triangular element, the value differs for each node. Here, as one example, the average value of distortion values of respective elements in the vicinity of a node is implemented as the value of distortion at this node.

Figure 2B:
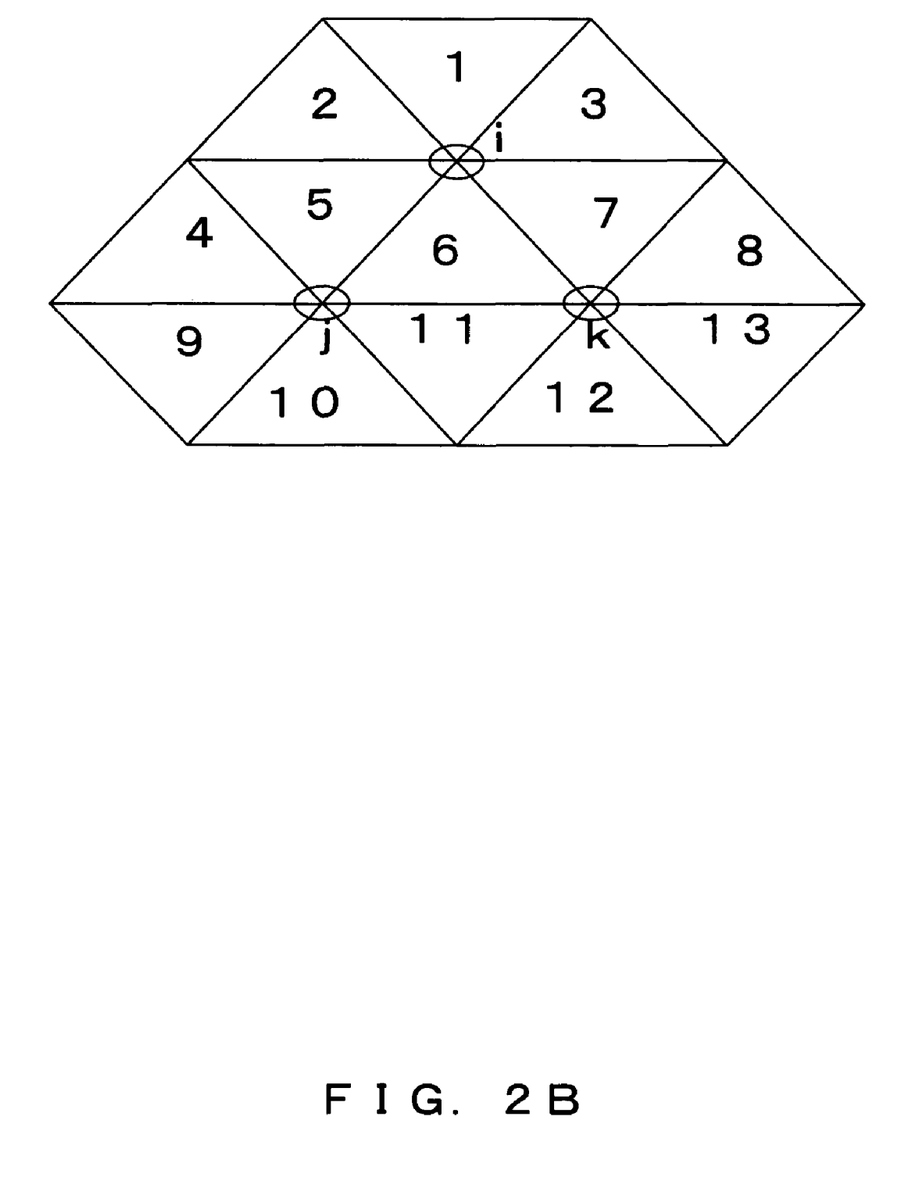
FIG. 2B is a diagram showing a calculation example of node distortion in the triangular element.

FIG. 2B shows the elements in the vicinity used to calculate distortion at the three nodes, i, j, and k, of a triangular element. In FIG. 2B, the number inside each element is assumed to show the element number of the element. At this time, distortions $\epsilon x^i$, $\epsilon x^j$, and $\epsilon x^k$ in the x direction at nodes i, j, and k are provided by the following expressions, as the average value of the distortions $\epsilon x^t$ (t=1, 2, ..., 13) of the six elements in the vicinity.

$$\epsilon x^i = (\epsilon x^1 + \epsilon x^2 + \epsilon x^3 + \epsilon x^5 + \epsilon x^6 + \epsilon x^7)/6$$
$$\epsilon x^j = (\epsilon x^4 + \epsilon x^5 + \epsilon x^6 + \epsilon x^9 + \epsilon x^{10} + \epsilon x^{11})/6$$
$$\epsilon x^k = (\epsilon x^6 + \epsilon x^7 + \epsilon x^8 + \epsilon x^{11} + \epsilon x^{12} + \epsilon x^{13})/6 \tag{12}$$

With regards to distortions $\epsilon y^i$, $\epsilon y^j$, and $\epsilon y^k$ in the y direction and shear distortions $\gamma xy^i$, $\gamma xy^j$, and $\gamma xy^k$, they are provided in the same way, as the average value of the distortions of the six elements in the vicinity, as well.

Although, in this way, a different distortion value can be obtained for each node, an interpolation method with higher accuracy is considered using this node distortion. It is presumed that the node displacement u inside the original triangular element is provided by a quadratic function such as the following expression:

$$u(x,y) = a + bx + cy + (1/2)Ax^2 + (1/2)By^2 + Cxy \tag{13}$$

Here, as invariables a, b, and c, the values calculated by expression (7) are used. Invariable A is the value wherein u of expression (13) is partially differentiated twice by x.

$$A = \partial^2 u/\partial x^2 \tag{14}$$

Similarly, invariable B is the value wherein u of expression (13) is partially differentiated twice by y.

$$B = \partial^2 u/\partial y^2 \tag{15}$$

In addition, invariable C is the value wherein u of expression (13) is partially differentiated by x and y.

$$C = \partial^2 u/\partial x \partial y \tag{16}$$

However, using expression (10), the right side of expression (14) can be changed as $\partial^2 u/\partial x^2 = \partial(\partial u/\partial x)/\partial x = \partial(\epsilon x)/\partial x$. Then, using the node distortion values $\epsilon x^i$ and $\epsilon x^k$ of neighboring nodes, the value of A in expression (14) can be calculated approximately, as below:

$$A = \partial(\epsilon x)/\partial x \tag{17}$$
$$= (\epsilon x^k - \epsilon x^j)/(xk - xi)$$

Similarly, B in expression (15) and C in expression (16) can be calculated approximately, as below:

$$B = \partial(\partial u/\partial y)/\partial y \tag{18}$$
$$= \partial(\gamma xy - \partial v/\partial x)/\partial y$$
$$= \partial(\gamma xy)/\partial y - \partial^2 v/\partial x \partial y$$
$$= \partial(\gamma xy)/\partial y - \partial(\partial v/\partial y)/\partial x$$
$$= \partial(\gamma xy)/\partial y - \partial(\epsilon y)/\partial x$$
$$= (\gamma xy^k - \gamma xy^j)/(yk - yi) - (\epsilon y^k - \epsilon y^j)/(xk - xi)$$

$$C = \partial(\epsilon x)/\partial y \tag{19}$$
$$= (\epsilon x^k - \epsilon x^j)/(yk - yi)$$

In addition, node displacement v is provided by a quadratic function such as the following expression, as in expression (13).

$$v(x,y) = d + ex + fy + (1/2)Dx^2 + (1/2)Ey^2 + Fxy \tag{20}$$

Here, the values calculated using expression (8) are used as invariables d, e, and f, and the values calculated by the following expressions are used as invariables D, E, and F.

$$D = \partial^2 v/\partial x^2 \tag{21}$$
$$= \partial(\partial v/\partial x)/\partial x$$
$$= \partial(\gamma xy - \partial u/\partial y)/\partial x$$
$$= \partial(\gamma xy)/\partial x - \partial^2 u/\partial y \partial x$$
$$= \partial(\gamma xy)/\partial x - \partial(\partial u/\partial x)/\partial y$$
$$= \partial(\gamma xy)/\partial x - \partial(\epsilon x)/\partial y$$
$$= (\gamma xy^k - \gamma xy^j)/(xk - xi) - (\epsilon x^k - \epsilon x^j)/(yk - yi)$$

$$E = \partial^2 v/\partial y^2 \tag{22}$$
$$= \partial(\partial v/\partial y)/\partial y$$
$$= \partial(\epsilon y)/\partial y$$
$$= (\epsilon y^k - \epsilon y^j)/(yk - yi)$$

$$F = \partial^2 v/\partial x \partial y \tag{23}$$
$$= \partial(\epsilon y)/\partial x$$
$$= (\epsilon y^k - \epsilon y^j)/(xk - xi)$$

In this way, by using the invariables determined by expressions (17) to (19) in expression (13) and using the invariables determined by expressions (21) to (23) in expression (20), it is possible to approximate the node displacement inside an element with a quadratic function. Therefore, by using node distortion, interpolation with increased accuracy is considered possible.

Although the differences in the distortion values and coordinate values between node i and node k are used in expressions (17) to (19) and (21) to (23), the differences between node i and node j or the differences between node j and node k can also be used instead.

Next, interpolation method using a quadratic function in a three-dimensional problem is described. In this case, as shown in FIG. 3, the four global nodes in the vicinity of a node of the micro model are considered as a tetrahedral element and interpolation is performed using the shape function of the tetrahedral element.

Figure 3:
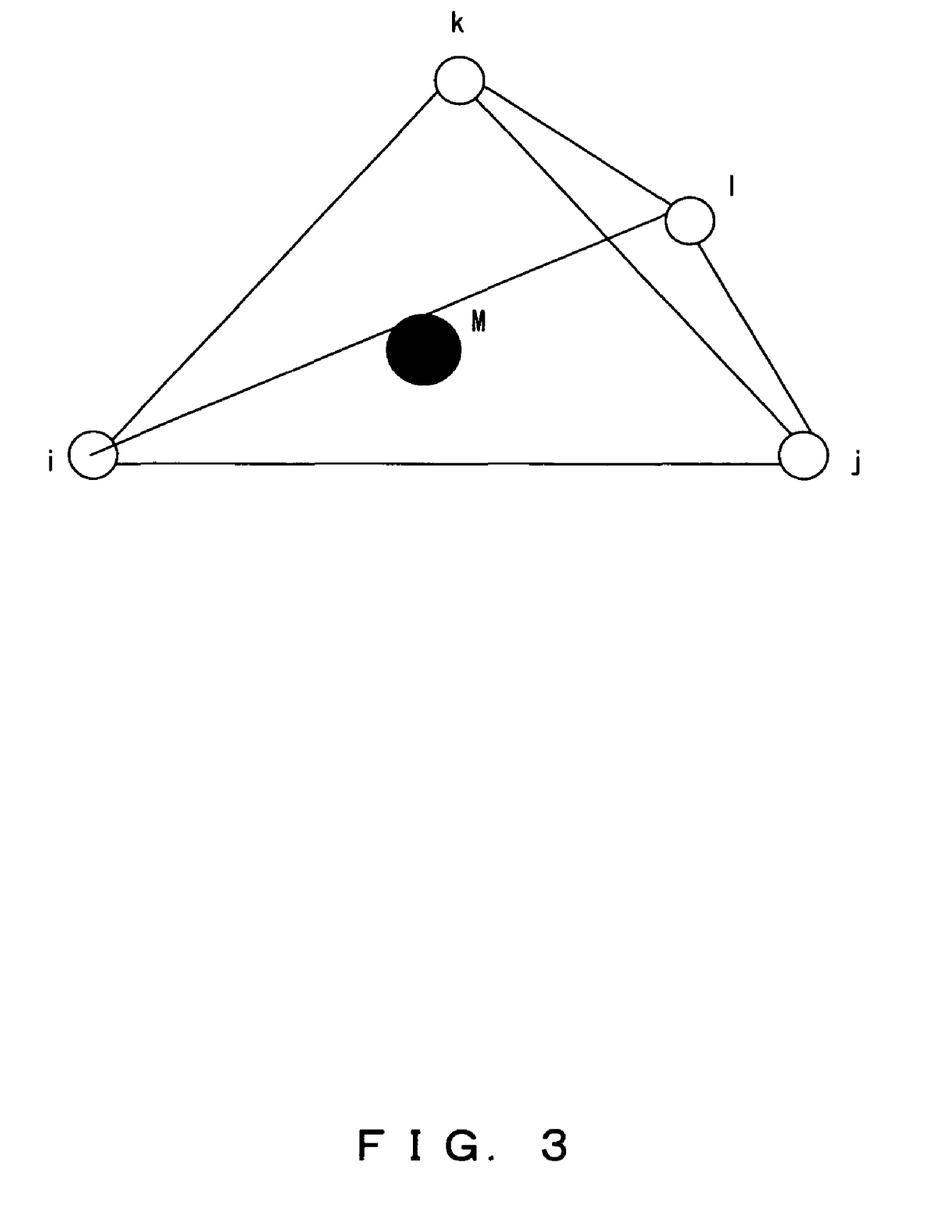
FIG. 3 is a diagram showing a tetrahedral element.

In FIG. 3, nodes i, j, k, and l are nodes on the mesh of a global structure and node M is a node on the mesh of a micro-structure. If the space coordinates of the node is (x, y, z) and displacements in the x direction, y direction, and z direction are u, v, and w, respectively, the coordinates and displacements of these nodes are shown as follows:
i coordinates (xi, yi, zi) displacements (ui, vi, wi)
j coordinates (xj, yj, zj) displacements (uj, vj, wj)
k coordinates (xk, yk, zk) displacements (uk, vk, wk)
l coordinates (xl, yl, zl) displacements (ul, vl, wl)
M coordinates (xm, ym, zm) displacements (um, vm, wm)

First, displacements inside the tetrahedral element is approximated by the following expressions, as a linear function with respect to space coordinates.

$$u(x,y,z)=a+bx+cy+dz$$

$$v(x,y,z)=e+fx+gy+hz$$

$$w(x,y,z)=p+qx+ry+sz \quad (24)$$

At this time, the following expressions are obtained:

$$\begin{pmatrix} 1 & xi & yi & zi \\ 1 & xj & yj & zj \\ 1 & xk & yk & zk \\ 1 & xl & yl & zl \end{pmatrix} \begin{pmatrix} a \\ b \\ c \\ d \end{pmatrix} = \begin{pmatrix} ui \\ uj \\ uk \\ ul \end{pmatrix} \quad (25)$$

$$\begin{pmatrix} 1 & xi & yi & zi \\ 1 & xj & yj & zj \\ 1 & xk & yk & zk \\ 1 & xl & yl & zl \end{pmatrix} \begin{pmatrix} e \\ f \\ g \\ h \end{pmatrix} = \begin{pmatrix} vi \\ vj \\ vk \\ vl \end{pmatrix} \quad (26)$$

$$\begin{pmatrix} 1 & xi & yi & zi \\ 1 & xj & yj & zj \\ 1 & xk & yk & zk \\ 1 & xl & yl & zl \end{pmatrix} \begin{pmatrix} p \\ q \\ r \\ s \end{pmatrix} = \begin{pmatrix} wi \\ wj \\ wk \\ wl \end{pmatrix} \quad (27)$$

From expressions (25) to (27), the following expressions can be obtained as calculation formulas for determining invariables a to s.

$a=[ui(-xlykzj+xkylzj+xlyjzk-xjylzk-xkyjzl+xjykzl)+uj(xlykzi-xkylzi-xlyizk+xiylzk+xkyizl-xiykzl)+uk(-xlyjzi+xjylzi+xlyizj-xiylzj-xjyizl+xiyjzl)+ul(xkyjzi-xjykzi-xkyizj+xiykzj+xjyizk-xiyjzk)]/\Delta$ $b=[ui(ykzj-ylzj-yjzk+ylzk+yjzl-ykzl)+uj(-ykzi+ylzi+yizk-ylzk-yizl+ykzl)+uk(yjzi-ylzi-yizj+ylzj+yizl-yjzl)+ul(-yjzi+ykzi+yizj-ykzj-yizk+yjzk)]/\Delta$ $c=[ui(-xkzj+xlzj+xjzk-xlzk-xjzl+xkzl)+uj(xkzi-xlzi-xizk+xlzk+xizl-xkzl)+uk(-xjzi+xlzi+xizj-xlzj-xizl+xjzl)+ul(xjzi-xkzi-xizj+xkzj+xizk-xjzk)]/\Delta$ $d=[ui(xkyj-xlyj-xjyk+xlyk+xjyl-xkyl)+uj(-xkyi+xlyi+xiyk-xlyk-xiyl+xkyl)+uk(xjyi-xlyi-xiyj+xlyj+xiyl-xjyl)+ul(-xjyi+xkyi+xiyj-xkyj-xiyk+xjyk)]/\Delta$ $e=[vi(-xlykzj+xkylzj+xlyjzk-xjylzk-xkyjzl+xjykzl)+vj(xlykzi-xkylzi-xlyizk+xiylzk+xkyizl-xiykzl)+vk(-xlyjzi+xjylzi+xlyizj-xiylzj-xjyizl+xiyjzl)+vl(xkyjzi-xjykzi-xkyizj+xiykzj+xjyizk-xiyjzk)]/\Delta$ $f=[vi(ykzj-ylzj-yjzk+ylzk+yjzl-ykzl)+vj(-ykzi+ylzi+yizk-ylzk-yizl+ykzl)+vk(yjzi-ylzi-yizj+ylzj+yizl-yjzl)+vl(-yjzi+ykzi+yizj-ykzj-yizk+yjzk)]/\Delta$ $g=[vi(-xkzj+xlzj+xjzk-xlzk-xjzl+xkzl)+vj(xkzi-xlzi-xizk+xlzk+xizl-xkzl)+vk(-xjzi+xlzi+xizj-xlzj-xizl+xjzl)+vl(xjzi-xkzi-xizj+xkzj+xizk-xjzk)]/\Delta$ $h=[vi(xkyj-xlyj-xjyk+xlyk+xjyl-xkyl)+vj(-xkyi+xlyi+xiyk-xlyk-xiyl+xkyl)+vk(xjyi-xlyi-xiyj+xlyj+xiyl-xjyl)+vl(-xjyi+xkyi+xiyj-xkyj-xiyk+xjyk)]/\Delta$ $p=[wi(-xlykzj+xkylzj+xlyjzk-xjylzk-xkyjzl+xjykzl)+wj(xlykzi-xkylzi-xlyizk+xiylzk+xkyizl-xiykzl)+wk(-xlyjzi+xjylzi+xlyizj-xiylzj-xjyizl+xiyjzl)+wl(xkyjzi-xjykzi-xkyizj+xiykzj+xjyizk-xiyjzk)]/\Delta$ $q=[wi(ykzj-ylzj-yjzk+ylzk+yjzl-ykzl)+wj(-ykzi+ylzi+yizk-ylzk-yizl+ykzl)+wk(yjzi-ylzi-yizj+ylzj+yizl-yjzl)+wl(-yjzi+ykzi+yizj-ykzj-yizk+yjzk)]/\Delta$ $r=[wi(-xkzj+xlzj+xjzk-xlzk-xjzl+xkzl)+wj(xkzi-xlzi-xizk+xlzk+xizl-xkzl)+wk(-xjzi+xlzi+xizj-xlzj-xizl+xjzl)+wl(xjzi-xkzi-xizj+xkzj+xizk-xjzk)]/\Delta$ $s=[wi(xkyj-xlyj-xjyk+xlyk+xjyl-xkyl)+wj(-xkyi+xlyi+xiyk-xlyk-xiyl+xkyl)+wk(xjyi-xlyi-xiyj+xlyj+xiyl-xjyl)+wl(-xjyi+xkyi+xiyj-xkyj-xiyk+xjyk)]/\Delta$ $\Delta=xkyjzi-xlyjzi-xjykzi+xlykzi+xjylzi-xkylzi-xkyizj+xlyizj+xiykzj-xlykzj-xiylzj+xkylzj+xjyizk-xlyizk-xiyjzk+xlyjzk+xiylzk-xjylzk-xjyizl+xkyizl+xiyjzl-xkyjzl-xiykzl+xjykzl$ (28)

Next, the definition of distortion in a three-dimensional problem is as follows:

$$\epsilon x=\partial u/\partial x$$

$$\epsilon y=\partial v/\partial y$$

$$\epsilon z=\partial w/\partial z$$

$$\gamma xy=\partial u/\partial y+\partial v/\partial x$$

$$\gamma yz=\partial v/\partial z+\partial w/\partial y$$

$$\gamma zx=\partial w/\partial x+\partial u/\partial z \quad (29)$$

$\epsilon x$, $\epsilon y$, and $\epsilon z$ indicate distortion in the x direction, y direction, and z direction, respectively, and $\gamma xy$, $\gamma yz$, and $\gamma zx$ indicate shear distortions. At this time, respective distortions at the four nodes, i, j, k, and l, of the tetrahedral element can be determined as the average value of the distortions of the elements in the vicinity, as in two-dimensional problems.

Here, node displacement u inside the tetrahedral element is presumed to be provided by a quadratic function such as the following expression:

$$u(x,y,z)=a+bx+cy+dz+(1/2)Ax^2+(1/2)By^2+(1/2)Cz^2+Dxy+Eyz+Fzx \quad (30)$$

The values determined in expression (28) are used as invariables a to d in expression (30), and values of invariables A to F are calculated approximately using the node distortion values of neighboring nodes as follows:

$$A = \partial^2 u / \partial x^2 \tag{31}$$
$$= \partial(\partial u / \partial x) / \partial x$$
$$= \partial(\varepsilon x) / \partial x$$
$$= (\varepsilon x^k - \varepsilon x^i) / (xk - xi)$$

$$B = \partial(\partial u / \partial y) / \partial y \tag{32}$$
$$= \partial(\gamma xy - \partial v / \partial x) \partial y$$
$$= \partial(\gamma xy) / \partial y - \partial^2 v / \partial x \partial y$$
$$= \partial(\gamma xy) / \partial y - \partial(\partial v / \partial y) / \partial x$$
$$= \partial(\gamma xy) / \partial y - \partial(\varepsilon y) / \partial x$$
$$= (\gamma xy^k - \gamma xy^i) / (yk - yi) - (\varepsilon y^k - \varepsilon y^i) / (xk - xi)$$

$$C = \partial^2 u / \partial z^2 \tag{33}$$
$$= \partial(\partial u / \partial z) / \partial z$$
$$= \partial(\gamma zw - \partial w / \partial x) / \partial z$$
$$= \partial(\gamma zx) / \partial z - \partial^2 w / \partial x \partial z$$
$$= \partial(\gamma zx) / \partial z - \partial(\partial w / \partial z) / \partial x$$
$$= \partial(\gamma zx) / \partial z - \partial(\varepsilon z) / \partial x$$
$$= (\gamma zx^k - \gamma zx^i) / (zk - zi) - (\varepsilon z^k - \varepsilon z^i) / (xk - xi)$$

$$D = \partial^2 u / \partial x \partial y \tag{34}$$
$$= \partial(\varepsilon x) / \partial y$$
$$= (\varepsilon x^k - \varepsilon x^i) / (yk - yi)$$

$$E = \partial^2 u / \partial y \partial z \tag{35}$$
$$= \{\partial(\gamma xy) / \partial z + \partial(\gamma zx) / \partial y - \partial(\gamma yz) / \partial x\} / 2$$
$$= \{(\gamma xy^k - \gamma xy^i) / (zk - zi) + (\gamma zx^k - \gamma zx^i) / (yk - yi) - (\gamma yz^k - \gamma yz^i) / (xk - xi)\} / 2$$

$$F = \partial^2 u / \partial z \partial x \tag{36}$$
$$= \partial(\varepsilon x) / \partial z$$
$$= (\varepsilon x^k - \varepsilon x^i) / (zk - zi)$$

The derivation procedure of expression (35) is as described below.

The following expression is obtained from the definition of yxy and yzx in expression (29).

$$\partial \gamma xy / \partial z = \partial^2 u / \partial y \partial z + \partial^2 v / \partial x \partial z \tag{37}$$

$$\partial \gamma yz / \partial x = \partial^2 v / \partial z \partial x + \partial^2 w / \partial y \partial x \tag{38}$$

$$\partial \gamma zx / \partial y = \partial^2 w / \partial x \partial y + \partial^2 u / \partial z \partial y \tag{39}$$

The following expression can be obtained if the left sides of expression (37) and expression (39) and the right sides of expression (37) and expression (39) are added together respectively:

$$\partial \gamma xy / \partial z + \partial \gamma zx / \partial y = 2(\partial^2 u / \partial y \partial z) + \partial^2 v / \partial x \partial z + \partial^2 w / \partial x \partial y \tag{40}$$

The following expression can be obtained from expression (38) and expression (40):

$$2(\partial^2 u / \partial y \partial z) = \partial \gamma xy / \partial z + \partial \gamma zx / \partial y - \partial \gamma yz / \partial x \tag{41}$$

The right side of expression (35) can be changed as stated above by using expression (41).

In addition, node displacements v and w are provided by a quadratic function such as the following expression, as in expression (30).

$$v(x,y,z) = e + fx + gy + hz + (½)Gx^2 + (½)Hy^2 + (½)Iz^2 + Jxy + Kyz + Lzx \tag{42}$$

$$w(x,y,z) = p + qx + ry + sz + (½)Mx^2 + (½)Ny^2 + (½)Pz^2 + Qxy + Ryz + Szx \tag{43}$$

The values determined by expression (28) are used as invariables e to s in expression (42) to expression (43) and the values of invariables G to S can be determined by using the node distortion values of the neighboring nodes, as with invariables A to F.

By using the invariables obtained in this way in expressions (30), (42) and (43), the node displacement inside an element can be approximated by a quadratic function, and high-accuracy interpolation can be performed.

Although the differences in distortion values and coordinate values between node i and node k are used in expressions (31) to (36), in actuality, the differences between two arbitrary nodes out of four nodes, i, j, k, and l, can be used.

Figure 4:
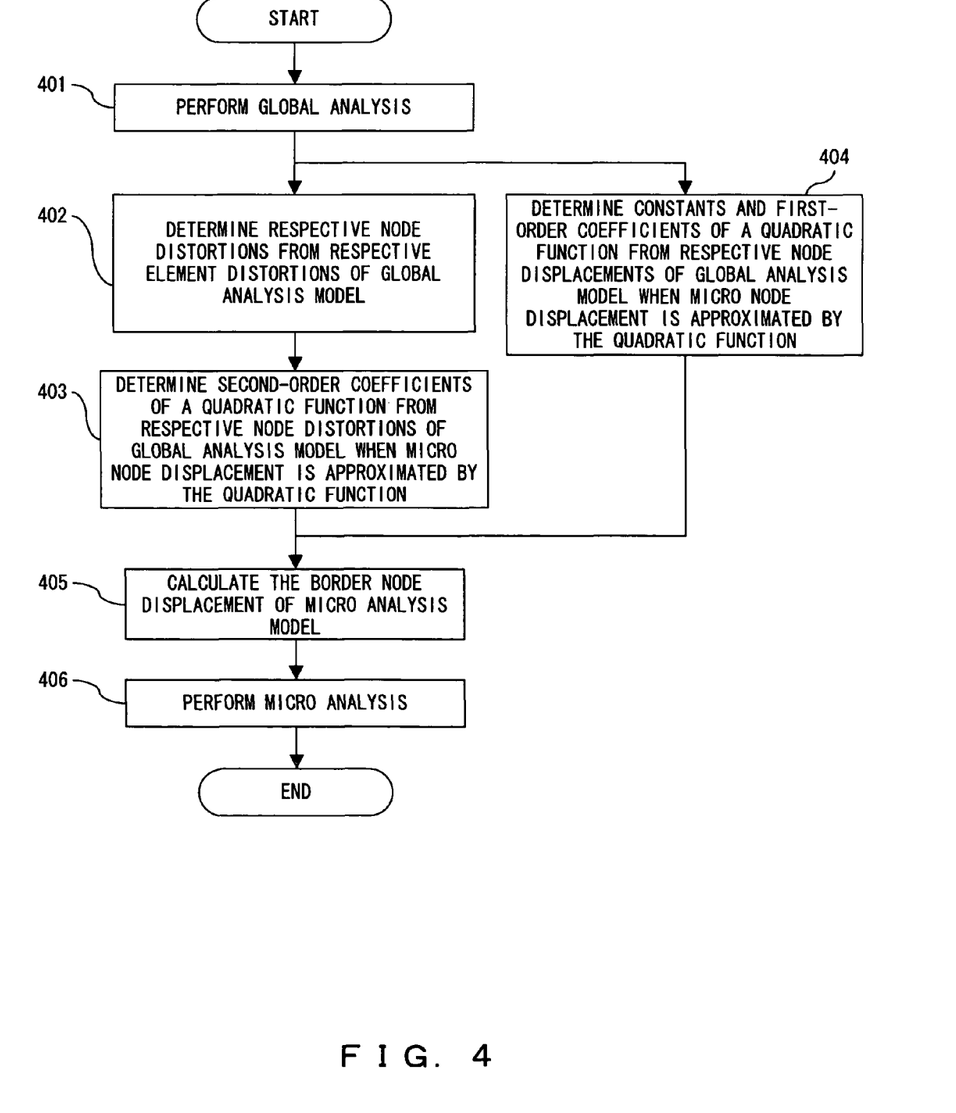
FIG. 4 is a flowchart of a zooming analysis.
Figure 5:
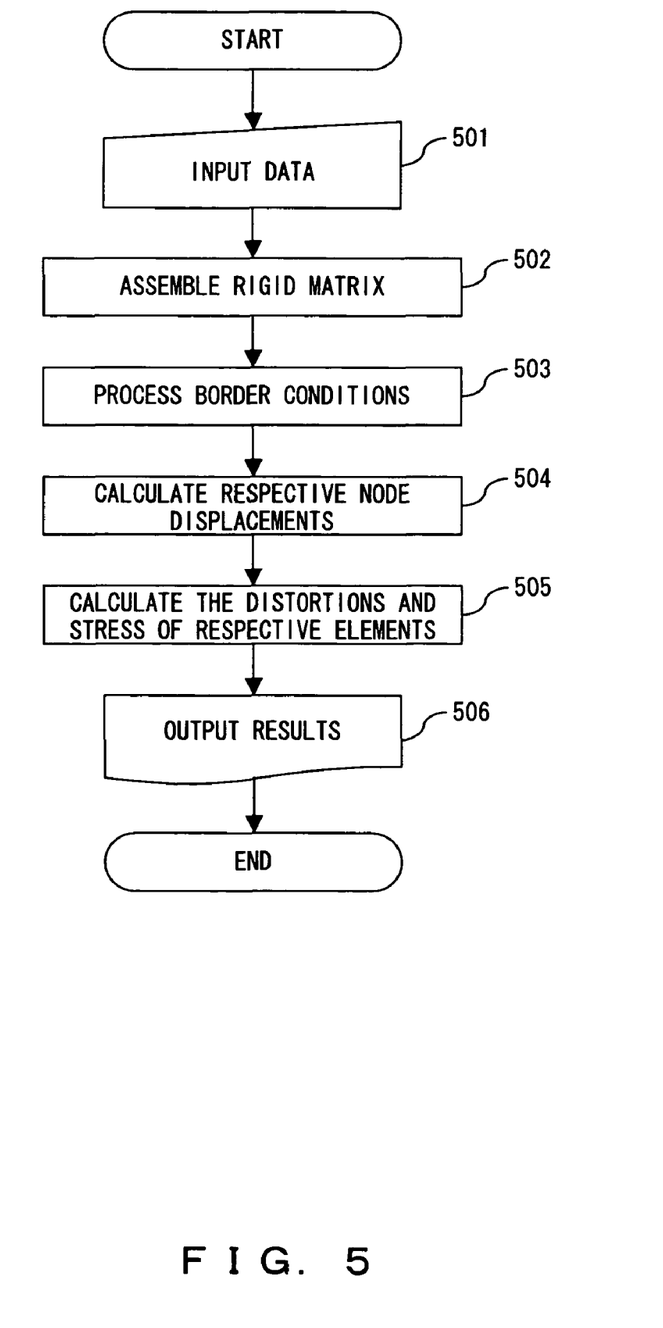
FIG. 5 is a flowchart of a global analysis.

Next, the flow of analysis processing by the multi-scale analysis device of the present embodiment is described, with reference to FIG. 4 and FIG. 5.

FIG. 4 is a flowchart of zooming analysis. The analysis device first performs global analysis of a structure which is an analysis target (step 401), and calculates the distortions of respective nodes from the distortions of respective elements of the global model used in global analysis (step 402).

Here, the distortion value of a node is determined by a predetermined calculation using the distortion values of a plurality of elements existing in the vicinity of the node. For example, if the average distortion value is used in a two-dimensional problem, the distortion value of the node is calculated by expression (12) and the like. This is also the same for a three-dimensional problem.

Next, the second-order coefficient of an approximation formula approximating the displacement at each node of a micro model by a quadratic function is calculated from the obtained distortions of respective nodes (step 403). In the two-dimensional problem, the second-order coefficients A to F in expression (13) and expression (20) are calculated by expressions (17) to (19) and expressions (21) to (23). In the three-dimensional problem, the second-order coefficients A to F in expression (30) are calculated by expression (31) to (36) and the second-order coefficients G to S in expression (42) and expression (43) are calculated in the same way.

In addition, the constant terms and first-order coefficients of the foregoing approximation formula are calculated from the displacements of respective nodes of the global model (step 404). In the two-dimensional problem, invariables a to f in expression (13) and expression (20) are calculated using expressions (6) to (8). In the three-dimensional problem, invariables a to s in expressions (30), (42) and (43) are calculated using expression (28).

Next, the displacements in respective boundary nodes of the micro model are calculated using the foregoing approximation formula (step 405). In the two-dimensional problem, expression (13) and expression (20) are used as approximation formulas, and in the three-dimensional problem, expressions (30), (42) and (43) are used as approximation formulas.

Then, micro analysis is performed using the obtained displacements of the respective boundary nodes as boundary conditions (step 406).

FIG. 5 is a flowchart of the global analysis in step 401 in FIG. 4. First, the operator enters shape data of the structure, mesh division information of the analysis model, and boundary conditions into the analysis device (step 501).

The analysis device generates a rigid matrix of the structure based on the input mesh division information (step 502) and sets the input boundary conditions (step 503). Next, the displacements of respective nodes are calculated using the rigid matrix (step 504), the distortions and stress of respective elements are calculated (step 505), and the calculation results are output (step 506).

Micro analysis in step 406 in FIG. 4 is also performed by the same procedures as the foregoing global analysis. However, the displacements in respective boundary nodes determined in step 405 are used as boundary conditions.

The multi-scale analysis device is configured using, for example, an information processing device (computer) such as that shown in FIG. 6. The information processing device in FIG. 6 comprises a CPU 601, memory 602, an input device 603, an output device 604, an external memory device 605, a medium driver device 606, and a network connection device 607, which are mutually connected by bus 608.

Memory 602 comprises, for example, ROM (read only memory) and RAM (random access memory) and stores programs and data used in processing. CPU 601 performs the foregoing zooming analysis by executing a program using memory 602.

Input device 603 is, for example, a keyboard or a pointing device and is used to input instructions or information from an operator. Output device 604 is, for example, a display, printer, or a speaker and is used to output inquiries to the operator and processing results.

External memory device 605 is, for example, a magnetic disk device, optical disk device, magneto-optical disk device, or tape device. Information processing device stores programs and data to this external memory device 605, loads these to memory 602 and uses these as needed.

Medium driver device 606 drives a portable recording medium 609 and accesses its recorded contents. Portable recording medium 609 is an arbitrary computer-readable recording medium, such as a memory card, flexible disk, optical disk, and magneto-optical disk. The operator stores programs and data to this portable recording medium and loads these to memory 602 and uses these as needed.

Network connection device 607 is connected to a communication network such as a LAN (local area network) and performs data conversion accompanying communication. The information processing device receives programs and data from an external device via the network connection device 607, loads these to memory 602 and uses these as needed.

Figure 7:
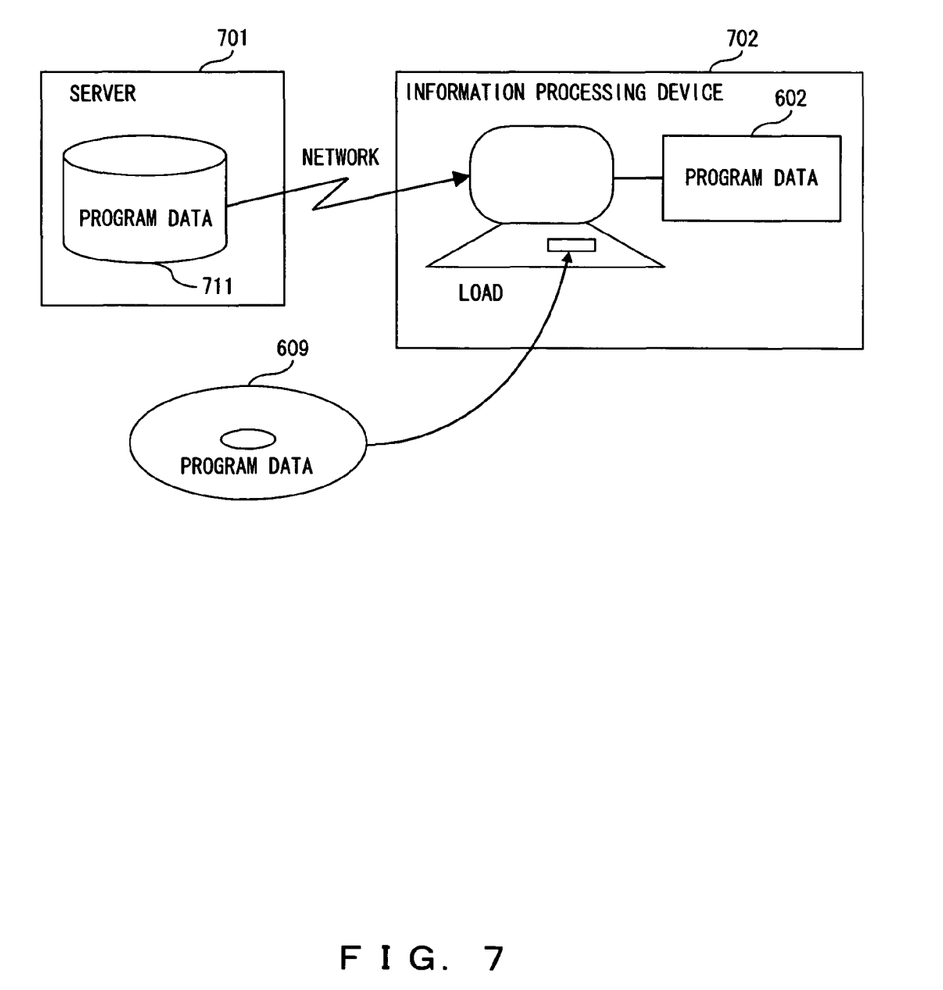
FIG. 7 is a diagram showing a method for providing program and data.

FIG. 7 shows a method for providing programs and data to the information processing device in FIG. 6. The programs and data stored in portable recording medium 609 and database 711 in server 701 are loaded to memory 602 in information processing device 702. Server 701 generates a propagation signal for propagating these programs and data and sends the signal to information processing device 702 via an arbitrary transmission medium on the communication network. CPU 601 executes the program using the data and performs required processing.

What is claimed is:

1. A multi-scale analysis device for performing a finite element analysis of a structure, from a global structure to a micro-structure, comprising:

an analysis result storage device for storing information of coordinates and displacements of respective nodes and distortions of respective elements in a finite element analysis result of a global model wherein the structure has been mesh-divided;

a first calculation formula storage device for storing a first calculation formula for determining a constant term and a first-order coefficient of a quadratic function of coordinates from the coordinates and displacements of the respective nodes of the global model, the quadratic function representing a displacement of each node of a micro model wherein the structure is mesh-divided finer than the global model;

a second calculation formula storage device for storing a second calculation formula for determining a second-order coefficient of the quadratic function from the coordinates and distortions of the respective nodes of the global model;

a distortion calculation device for calculating a distortion of each node of the global model from distortions of a plurality of elements existing in a vicinity of the node;

a distortion storage device for storing information of the obtained distortion of each node;

a displacement calculation device for calculating the constant term and first-order coefficient from the coordinates and displacements of the respective nodes of the global model using the first calculation formula, calculating the second-order coefficient from the coordinates of the respective nodes of the global model and the distortions of the respective nodes stored in the distortion storage device using the second calculation formula, and calculating a displacement of each boundary node of the micro model using the obtained constant term, first-order coefficient, and second-order coefficient;

a displacement storage device for storing information of the obtained displacement of each boundary node; and an analysis device for performing a finite element analysis of the micro model using the displacement of each boundary node stored in the displacement storage device as a boundary condition of the micro model and outputting an analysis result.

2. A computer-readable recording medium storing a program for a computer which performs a finite element analysis of a structure, from a global structure to a micro-structure, the program enabling the computer to perform:

extracting information of distortions of respective elements in a finite element analysis result of a global model wherein the structure has been mesh-divided from an analysis result storage device;

calculating a distortion of each node of the global model from distortions of a plurality of elements existing in a vicinity of the node and storing the obtained distortion of each node in a distortion storage device;

extracting a first calculation formula for determining a constant term and a first-order coefficient of a quadratic function of coordinates from coordinates and displacements of respective nodes of the global model from a first calculation formula storage device, the quadratic function representing a displacement of each node of a micro model wherein the structure is mesh-divided finer than the global model;

extracting information of the coordinates and displacements of the respective nodes of the global model from the analysis result storage device;

calculating the constant term and first-order coefficient from the coordinates and displacements of the respective nodes of the global model using the first calculation formula;

extracting a second calculation formula for determining a second-order coefficient of the quadratic function from the coordinates and distortions of the respective nodes of the global model from a second calculation formula storage device;

extracting information of the coordinates of the respective nodes of the global model from the analysis result storage device;

extracting information of the distortions of the respective nodes from the distortion storage device;

calculating the second-order coefficient from the coordinates and distortions of the respective nodes of the global model using the second calculation formula;

calculating a displacement of each boundary node of the micro model using the obtained constant term, first-order coefficient, and second-order coefficient and storing the obtained displacement of each boundary node in a displacement storage device; and performing a finite element analysis of the micro model using the displacement of each boundary node stored in the displacement storage device as a boundary condition and outputting an analysis result.

3. The recording medium according to claim 2, wherein said program enables said computer to perform a process of determining an average value of the distortions of the plurality of elements as the distortion of each node of the global model.

4. A computerized multi-scale analysis method of performing a finite element analysis of a structure, from a global structure to a micro-structure, comprising:

extracting information of distortions of respective elements in a finite element analysis result of a global model wherein the structure has been mesh-divided from an analysis result storage device;

calculating a distortion of each node of the global model from distortions of a plurality of elements existing in a vicinity of the node and storing the obtained distortion of each node in a distortion storage device;

extracting a first calculation formula for determining a constant term and a first-order coefficient of a quadratic function of coordinates from coordinates and displacements of respective nodes of the global model from a first calculation formula storage device, the quadratic function representing a displacement of each node of a micro model wherein the structure is mesh-divided finer than the global model;

extracting information of the coordinates and displacements of the respective nodes of the global model from the analysis result storage device;

calculating the constant term and first-order coefficient from the coordinates and displacements of the respective nodes of the global model using the first calculation formula;

extracting a second calculation formula for determining a second-order coefficient of the quadratic function from the coordinates and distortions of the respective nodes of the global model from a second calculation formula storage device;

extracting information of the coordinates of the respective nodes of the global model from the analysis result storage device;

extracting information of the distortions of the respective nodes from the distortion storage device;

calculating the second-order coefficient from the coordinates and distortions of the respective nodes of the global model using the second calculation formula;

calculating a displacement of each boundary node of the micro model using the obtained constant term, first-order coefficient, and second-order coefficient and storing the obtained displacement of each boundary node in a displacement storage device; and performing a finite element analysis of the micro model using the displacement of each boundary node stored in the displacement storage device as a boundary condition and outputting an analysis result.

\* \* \* \* \*